US007895610B1

(12) United States Patent
Dasgupta

(10) Patent No.: US 7,895,610 B1
(45) Date of Patent: Feb. 22, 2011

(54) SYSTEM AND METHOD FOR DISPLAYING INFORMATION ON THE SCREEN OF A USER INTERFACE DEVICE UNDER THE CONTROL OF A DIGITAL AUDIO PLAYBACK DEVICE

(75) Inventor: Aninda Dasgupta, Croton on Hudson, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 2255 days.

(21) Appl. No.: 09/691,334

(22) Filed: Oct. 18, 2000

Related U.S. Application Data

(60) Provisional application No. 60/176,563, filed on Jan. 18, 2000.

(51) Int. Cl.
G06F 3/00 (2006.01)
H04N 5/765 (2006.01)

(52) U.S. Cl. ...................................... 719/328; 386/200

(58) Field of Classification Search ............. 709/328; 719/328, 310; 386/83, 107, 200; 725/86, 725/1; 715/700
See application file for complete search history.

(56) References Cited

U.S. PATENT DOCUMENTS

| | | | | |
|---|---|---|---|---|
| 4,422,105 A * | 12/1983 | Rodesch et al. | .............. | 386/83 |
| 5,434,913 A * | 7/1995 | Tung et al. | ............. | 379/202.01 |
| 5,751,962 A * | 5/1998 | Fanshier et al. | ............. | 709/223 |
| 5,987,525 A | 11/1999 | Roberts et al. | .............. | 709/248 |
| 5,991,520 A * | 11/1999 | Smyers et al. | .............. | 710/100 |
| 6,081,263 A * | 6/2000 | LeGall et al. | ............... | 345/760 |
| 6,195,501 B1 * | 2/2001 | Perry et al. | ................... | 386/83 |
| 6,275,266 B1 * | 8/2001 | Morris et al. | ............... | 348/552 |
| 6,292,187 B1 * | 9/2001 | Gibbs et al. | .................. | 345/804 |
| 6,442,658 B1 * | 8/2002 | Hunt et al. | ................... | 711/158 |
| 6,631,435 B1 * | 10/2003 | Lym et al. | .................... | 710/305 |
| 6,681,043 B1 * | 1/2004 | Lau et al. | ..................... | 382/173 |
| 6,762,798 B1 * | 7/2004 | Messer et al. | ............... | 348/565 |
| 7,178,106 B2 * | 2/2007 | Lamkin et al. | .............. | 715/716 |
| 7,237,198 B1 * | 6/2007 | Chaney | ....................... | 715/730 |

FOREIGN PATENT DOCUMENTS

EP 0967609 A2 12/1999
WO 9806098 A1 2/1998

OTHER PUBLICATIONS

Rajan, Ganesh, Stream Media Control an synchronization application program interface (API) for a digital television receiver, Mar. 1999, Mar. 2000.*
Rolan Leins el al, Tivoli storage manager Window 2000, 1999.*
Paramvir bahl et al , Software-only Compression, Rending, and Playback of Digital Video, Apr. 11, 1996.*
David R. Bacher, Data entry and Administrative Tools for a Video-on-demand Metadata Database, 1997.*

* cited by examiner

Primary Examiner—Lechi Truong

(57) ABSTRACT

A digital audio playback device (DAPD) includes: 1) an external interface for coupling to a connected processing system that executes a user interface application program that accesses and controls the digital audio playback device via the external interface; 2) a memory coupled to the external interface for storing a reverse DAPD application programming interface (API); and 3) a processor coupled to the memory and the external interface for executing the reverse DAPD API. The reverse DAPD API causes the processor to access and control a user interface operated by the user interface application program displayed on a monitor screen of the connected processing system.

12 Claims, 4 Drawing Sheets

SYSTEM AND METHOD FOR DISPLAYING INFORMATION ON THE SCREEN OF A USER INTERFACE DEVICE UNDER THE CONTROL OF A DIGITAL AUDIO PLAYBACK DEVICE

This application claims priority under 35 U.S.C. §119(e) to U.S. Provisional Patent Application No. 60/176,563 entitled "A Method for Display and use of Manufacturer-Specific Information on user Interface Screen connected to a Digital Playback Device" filed Jan. 18, 2000.

TECHNICAL FIELD OF THE INVENTION

The present invention is directed, in general, to digital audio playback devices and, more specifically, to a digital audio playback device (DAPD) that is capable of displaying on the screen of a user interface device connected to the digital audio playback device.

BACKGROUND OF THE INVENTION

Digital audio playback devices (DAPD) are among the most popular consumer products created by the digital revolution. The term digital audio playback devices generally is applied to any device that stores and plays back audio files in a purely electronic format. The purely electronic format eliminates the need for mechanical parts that are comparatively expensive and easy to break. Typically, a digital audio playback device contains a large non-volatile memory, such as a flash random access memory (RAM), that stores, for example, 64 megabytes (MB) of audio files. One of the most popular types of digital audio playback devices on the market is the MP3 player. A user can download about an hour of MP3 music files to an MP3 player from another device, such as a personal computer (PC).

Users of digital audio playback devices interact and control the digital audio playback device with the help of a user interface (UI). The user interface of a digital audio playback device may be provided directly on the digital audio playback device (for example, a conventional CD player with buttons and an LCD display on the front panel of the player) or on another device, such as a PC, directly connected to the digital audio playback device. Frequently, a digital audio playback device may have a built-in UI and also may use a UI on an attached device (like a PC) for added convenience and features. For example, the RUSH™ MP3 player from Philips Electronics includes an LCD-based UI on the device and also operates via a UI software application on a connected personal computer. As digital audio playback devices become smaller and smaller, there is less room for control buttons and video displays on the exterior of the digital audio playback device. A pocket-sized digital audio playback device may have only three or four control buttons and a tiny LCD for displaying alphanumeric data. Hence, digital audio playback devices controlled by a user interface on a connected device are becoming increasingly common. It is common to refer to a UI built directly on the portable audio device as an "on-board UI." It also is common to refer to a UI on a connected device as a "connected UI."

An exemplary connected user interface (UI) on a connected PC may comprise a display that has the appearance of some type of conventional music playing device, such as a CD player. For example, the user interface may contain a Skip Forward button, a Skip Back button, a Pause button, a Stop button, and the like. The user presses these buttons using the mouse attached to the connected PC. The user interacts with the digital audio playback device while the digital audio playback device is connected to the PC, usually through some type of cradle device. While connected, the user can erase audio files currently in the digital audio playback device and can download new audio files to the digital audio playback device. When the user is finished configuring audio files on the digital audio playback device, the user can remove the digital audio playback device from its cradle and carry it around with him.

Digital audio playback devices and connected user interfaces for those devices are often developed and distributed by different parties. Typically, the connected user interface executed by the PC may control a digital audio playback device via some software libraries made available by the manufacturer of the digital audio playback device and resident on the connected device. In many cases, a digital audio playback device user can download the user interface software libraries from the Internet. These libraries typically consist of the device drivers needed to communicate with and control the digital audio playback device over the PC connection.

These libraries also contain implementations of application programming interfaces (APIs) that are supported by the digital audio playback device. An API is the interface through which a software program accesses lower level software functions, such as an operating system. The application programming interfaces for digital audio playback devices are often agreed to by several manufacturers of digital audio playback devices. As a result, a consumer may select one of several available user interface applications to operate the consumer's digital audio playback device.

A typical user interface application typically operates any of several digital audio playback devices in the market. Using application programming interfaces, developers and sellers of connected user interface application software can establish a relationship with consumers via the "look and feel" and the ease of use of their proprietary user interfaces. Further, connected user interface makers are also able to uniquely brand their user interface software and provide remote access capability for the consumer to visit the user interface maker's web site(s) of choice.

However, independent developers and sellers of connected user interface software are often reluctant to develop a customized user interface for each manufacturer of digital audio playback devices. This reluctance is partly due to the high development cost to customize user interface software for each manufacturer. The reluctance also is due to a strategy of connected user interface developers and sellers to attract consumers to a web site of the user interface maker's choice.

As noted above, user interface makers can use application programming interfaces to have their user interface software connect to and control any of several digital audio playback devices. Digital audio playback device makers would also like to have the ability to control the user interface software from their digital audio playback device (or associated drivers) and have a manufacturer-specific logo displayed on the user interface or allow the user to connect to a web site selected by the manufacturer of the digital audio playback device.

Therefore, there is a need in the art for systems and methods that provide an interface that digital audio playback device manufacturers may use to control the user interface software operating on a connected processing system, such as a personal computer. In particular, there is a need in the art for systems and methods that provide an interface that may be used by the digital audio playback device manufacturer to direct the consumer to a web site recommended by or operated by the digital audio playback device manufacturer.

SUMMARY OF THE INVENTION

To address the above-discussed deficiencies of the prior art, it is a primary object of an advantageous embodiment of the present invention to provide a digital audio playback device (DAPD) comprising: 1) an external interface capable of being coupled to a connected processing system, the connected processing system capable of executing a user interface application program that accesses and controls the digital audio playback device via the external interface; 2) a memory coupled to the external interface capable of storing a reverse DAPD application programming interface (API); and 3) a processor coupled to the memory and the external interface and capable of executing the reverse DAPD API, the reverse DAPD API capable of causing the processor to access and control a user interface associated with the user interface application program and displayed on a monitor screen associated with the connected processing system.

According to one embodiment of the present invention, the reverse DAPD API comprises executable instructions capable of communicating with and controlling an operation of the user interface application program.

According to another embodiment of the present invention, the reverse DAPD API comprises first data associated with a manufacturer of the digital audio playback device.

According to still another embodiment of the present invention, the reverse DAPD API is capable of causing the processor to access and control at least a portion of the user interface to display the first data in the at least a portion of the user interface displayed on the monitor screen.

According to yet another embodiment of the present invention, the first data comprises a graphics file comprising a logo image associated with the manufacturer.

According to a further embodiment of the present invention, the first data comprises a Universal Resource Locator (URL) associated with an Internet web site associated with the manufacturer.

A reverse DAPD application programming interface according to the principles of the present invention may also be implemented in a processing system, such as a personal computer, connected to the digital audio playback device (DAPD), rather than in the DAPD itself. Accordingly, it is a primary object of an advantageous embodiment of the present invention to provide a processing system comprising: 1) an external interface capable of being coupled to a connected digital audio playback device, the connected digital audio playback device capable of playing audio files stored in the digital audio playback device; 2) a memory coupled to the external interface capable of storing a user interface application program that accesses and controls the digital audio playback device via the external interface and capable of storing a reverse DAPD application programming interface (API); and 3) a processor coupled to the memory and the external interface and capable of executing the user interface application program and the reverse DAPD API, the reverse DAPD API capable of communicating with the digital audio playback device and enabling the digital audio playback device to access and control a user interface associated with the user interface application program and displayed on a monitor screen associated with the processing system.

In one embodiment of the present invention, the reverse DAPD API in the processing system comprises executable instructions capable of communicating with and controlling an operation of the user interface application program.

In another embodiment of the present invention, the reverse DAPD API in the processing system comprises first data associated with a manufacturer of the digital audio playback device.

In still another embodiment of the present invention, the reverse DAPD API in the processing system is capable of enabling the digital audio playback device to access and control at least a portion of the user interface to display the first data in the at least a portion of the user interface displayed on the monitor screen.

In yet another embodiment of the present invention, the first data in the processing system comprises a graphics file comprising a logo image associated with the manufacturer.

In a further embodiment of the present invention, the first data in the processing system comprises a Universal Resource Locator (URL) associated with an Internet web site associated with the manufacturer.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged digital audio playback device or connected processing system.

Figure 1:
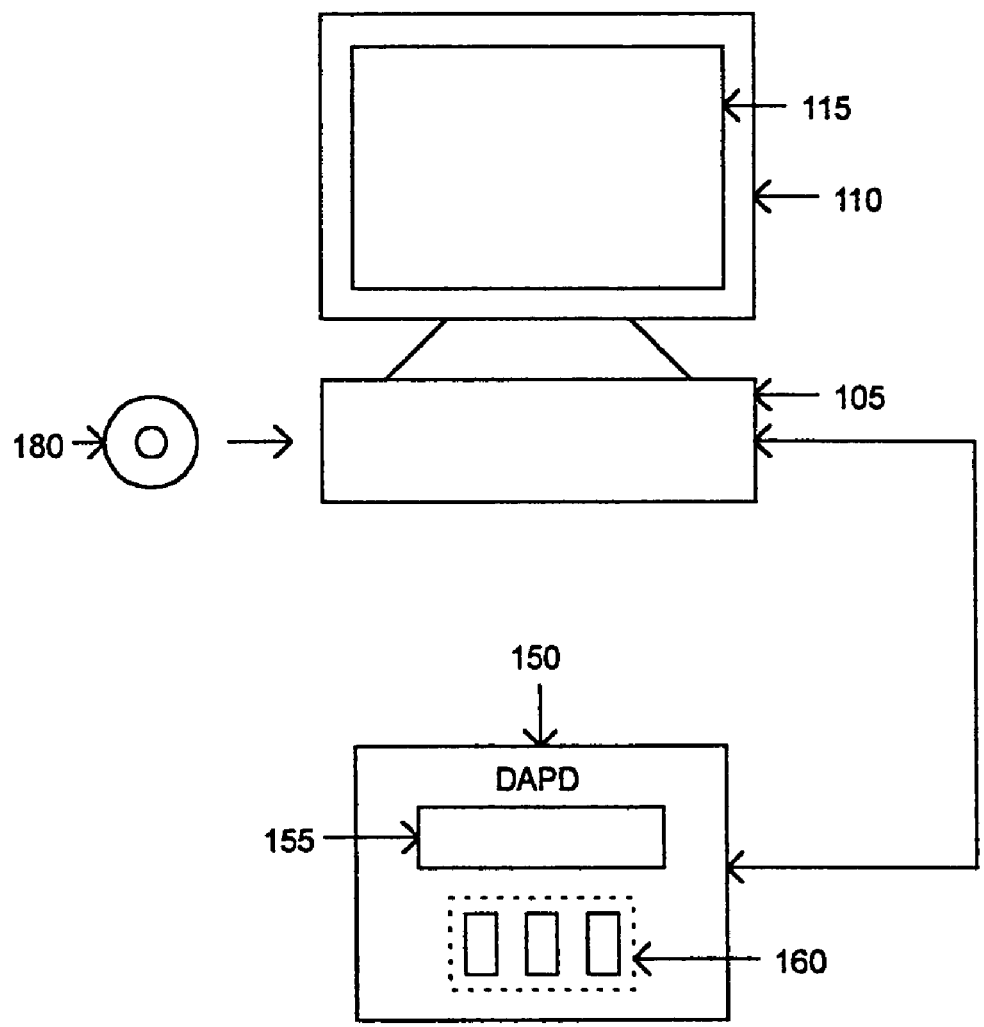
FIG. 1 illustrates an exemplary digital audio playback device (DAPD) and a connected personal computer (PC) according to one embodiment of the present invention.

FIG. 1 illustrates exemplary digital audio playback device (DAPD) 150 and connected personal computer (PC) 105 according to one embodiment of the present invention. PC 105 executes a user interface (UI) application program capable of controlling and interacting with DAPD 150. As will be explained below in greater detail, DAPD 150 is also able to control and interact with the user interface application program executed by PC 105 through the use of one or more reverse application programming interfaces (APIs) installed in DAPD 150 and/or PC 105.

DAPD 150 comprises display 155 and control buttons 160, generally indicated by the dotted line. Display 155 is a small device, such as an LED or LCD, capable of displaying a relatively small number of alphanumeric characters and icons. Control buttons 160 perform operations typical of conventional audio devices, such as CD players. These operations include Skip Forward, Skip Back, Pause, Stop, Play, and the like. Control buttons 160 also allow a user to scroll through selectable audio files (such as MP3 files) stored in DAPD 150. The titles of the audio files may appear in display 155.

In an advantageous embodiment of the present invention, a user may interact with DAPD 150 through a user interface application program executed by PC 105. The user interface is displayed on screen 115 of monitor 110. The user enters commands on the keyboard and/or mouse associated with PC 105 to perform various tasks, including for example, browsing and downloading MP3 files on the Internet, viewing a directory of MP3 files stored in DAPD 150, viewing a directory of MP3 files stored in PC 105, deleting selected MP3 files from DAPD 150, transferring MP3 files from PC 105 to DAPD 150, and the like. In an advantageous embodiment of the present invention, the user interface application program uses a plurality of conventional application programming interfaces (APIs) to interact with digital audio playback devices made by different manufacturers. Additionally, each of the different digital audio playback devices may use one or more of a plurality of reverse DAPD application programming interfaces (APIs) according to the principles of the present invention to interact with the user interface.

In one embodiment of the present invention, the user interface application executed by PC 105 and an implementation of the reverse DAPD application programming interfaces may be stored on the hard disk drive of PC 105. Furthermore, a user interface application and reverse DAPD application programming interfaces according to the principles of the present invention may be stored as computer-readable data files and computer-executable instruction codes on removable storage medium 180, which may be, for example, a 3.5 inch floppy diskette, a CD ROM, a DVD, or a similar storage medium. Additionally, in an advantageous embodiment of the present invention, a user interface application and reverse DAPD application programming interfaces according to the principles of the present invention may be downloaded from removable storage medium 180 to DAPD 150 via PC 105.

Digital audio playback devices are available in the market with software libraries that contain hardware drivers, implementations of APIs that may be used to control the digital audio playback device, encryption and decryption software and keys, and other such software or data. These libraries are installed on PC 105 where the user interface application program executes, either by the maker of PC 105 or by the user. The installed libraries allow the user interface application program to interact with, pass data to, and generally control the digital audio playback device using an implementation of an API supported by the digital audio playback device and implemented in the library on PC 105.

Figure 3:
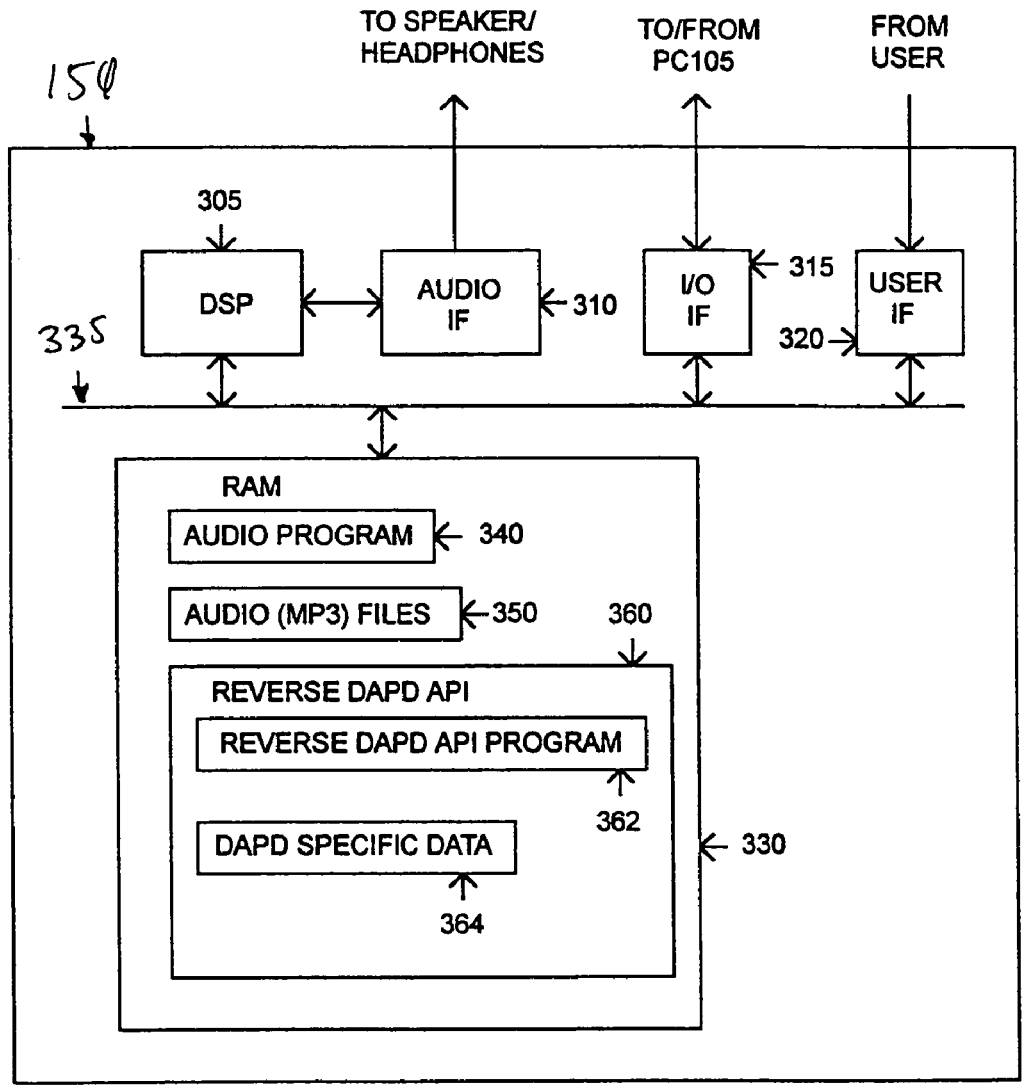
FIG. 3 illustrates exemplary reverse digital audio playback device application programming interfaces implemented in the exemplary DAPD according to one embodiment of the present invention.
Figure 4:
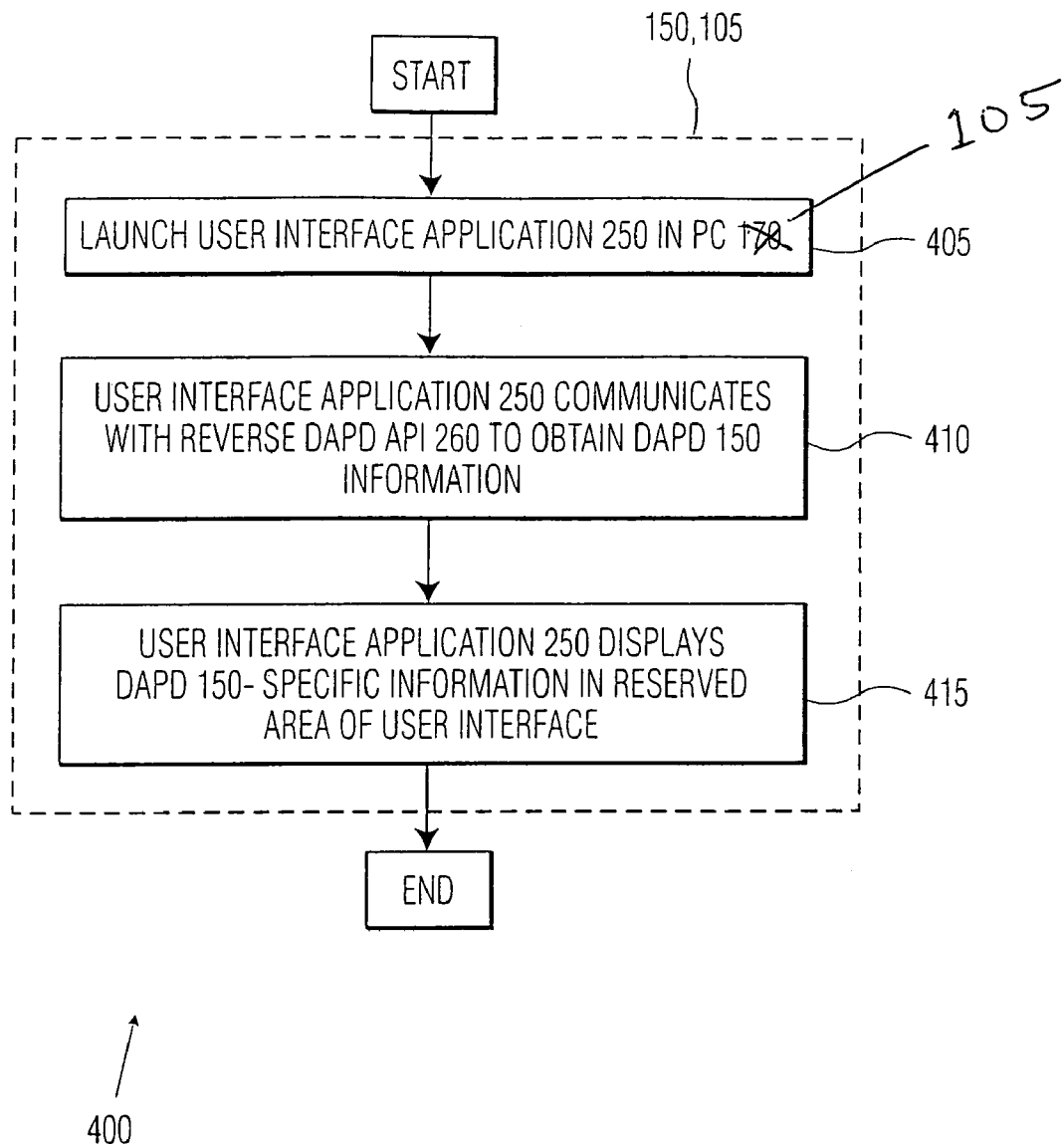
FIG. 4 is a flow diagram illustrating the operation of an exemplary DAPD according to one embodiment of the present invention.

Similarly, a reverse DAPD API is used by a digital audio playback device to request that the user interface application program display some information on screen 115, such as the logo of the DAPD manufacturer, or allow the user to access a DAPD-specific web site, or the like. As shown in FIGS. 3 and 4 below, reverse DAPD APIs according to the principles of the present invention may be implemented in the libraries installed on PC 105 or in the libraries in DAPD 150, or a combination of both.

In one embodiment, the reverse DAPD API is implemented in the libraries installed on PC 105. In such an embodiment, the reverse DAPD API may be in the form of DAPD-specific data (e.g., URLs of web sites recommended by the digital audio playback device manufacturer, bitmaps or graphics for the logo of the DAPD manufacturer, and the like) and some executable code that provides the DAPD-specific information to the user interface application program in a manner useful for display. Upon startup, the user interface application program uses the reverse DAPD APIs in the installed libraries to obtain the DAPD-specific data and uses the accompanying executable code to display DAPD-specific information in an agreed-upon portion of the user interface screen. If the user interacts with the DAPD-specific graphic or information on the screen, the user interface application program uses the executable code in the libraries to allow the user to visit a DAPD-specific web site or performs other tasks as defined by the reverse DAPD API specification.

An alternative method to achieve the same results is to provide the DAPD-specific data and executable code in DAPD 150 and to use the reverse DAPD API to allow the digital audio playback device to request from the user interface application program certain tasks as defined in the reverse DAPD API. In this method, the drivers installed on PC 105 implement a communication protocol to allow DAPD 150 to communicate with the user interface application program, to make requests for display of graphics, and to fulfill the user interface application program requests for URL information and the like.

Figure 2:
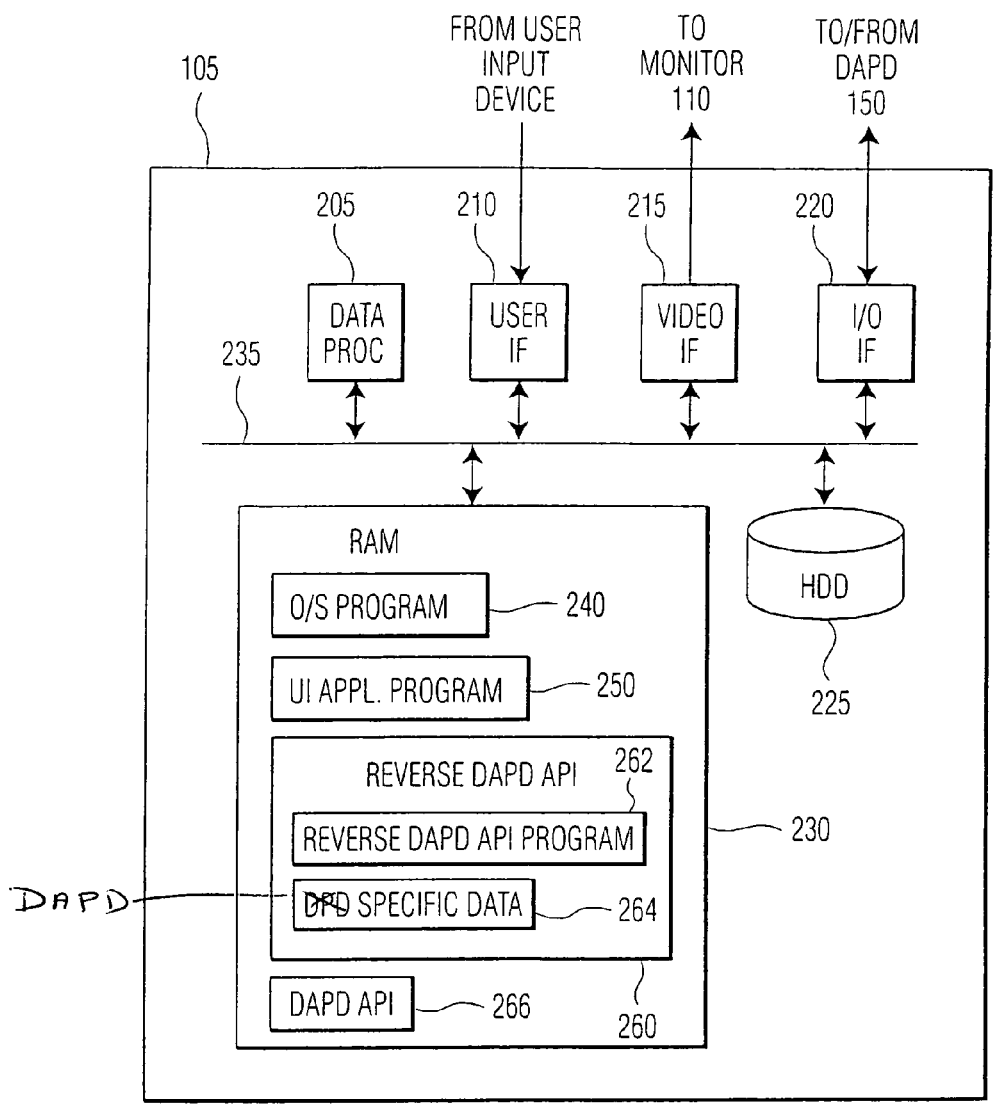
FIG. 2 illustrates exemplary reverse digital audio playback device application programming interfaces implemented in the exemplary connected PC according to one embodiment of the present invention.

FIG. 2 illustrates exemplary reverse digital audio playback device application programming interface 260 implemented in exemplary connected PC 105 according to one embodiment of the present invention. PC 105 comprises data processor 205, user interface (IF) 210, video interface (IF) 215, input/output (I/O) interface (IF) 220, storage device 225, which may be, for example, a hard disk drive (HDD), and random access memory (RAM) 230. Data processor 205, user IF 210, video IF 215, I/O IF 220, storage device 225, RAM 230 are coupled together by, and communicate through, communication bus 235. RAM 230 stores operating system (O/S)

program 240, user interface (UI) application program 250, reverse digital audio playback device (DAPD) application programming interface (API) 260, and DAPD API library 266. Reverse DAPD API 260 further comprises reverse DAPD API program 262 and DAPD specific data 264.

During normal operation of PC 105, data processor 205 executes O/S program 240 and, optionally, one or more applications selected by the user. If the user decides to download audio files, such as MP3 files, to DAPD 150 or to edit audio files already on DAPD 150, the user launches user interface (UI) application program 250. In an advantageous embodiment of the present invention, UI application program 250 provides the user with a user-friendly graphical user interface (GUI) that may resemble a conventional audio playing device. For example, the user interface associated with UI application program 250 may resemble a CD player that has a Skip Forward button, a Skip Back button, a Pause button, a Stop button, and the like.

The user may access and control DAPD 150 through user I/O IF 210 by entering commands and data with the keyboard or mouse of PC 105. UI application program 250 in turn accesses and controls DAPD 150 through I/O IF 220. In order to control a DAPD from any manufacturer, UI application program 250 may select one or more DAPD application programming interfaces (APIs) from DAPD API library 266. Each DAPD API in DAPD API library 266 is an interface through which a higher level software program, such as UI application program 250, accesses lower level software functions, such as the drivers in DAPD 150.

However, according to the principles of the present invention, DAPD 150 may access and control the user interface provided by UI application program 250. To accomplish this, data processor 205 also executes reverse DAPD API 260 in RAM 230. DAPD specific data 264 may comprise, for example, a URL of the web site operated by the manufacturer of DAPD 150 and a graphics file for the logo of the manufacturer of DAPD 150. Reverse DAPD API program 262 comprises, for example, executable code that formats the DAPD-specific information so that it may be displayed by UI application program 250. A portion of the user interface is reserved for displaying the logo and the web site of the manufacturer.

Alternatively, the reverse DAPD API may be installed in DAPD 150. FIG. 3 illustrates exemplary reverse digital audio playback device application programming interface 360 implemented in exemplary DAPD 150 according to one embodiment of the present invention. DAPD 150 comprises digital signal processor (DSP) 305, audio interface (IF) 310, input/output (I/O) interface (IF) 315, user interface (IF) 320, and random access memory (RAM) 330. DSP 305, audio IF 310, I/O IF 315, user IF 320, and RAM 330 are coupled together by, and communicate through, communications bus 335. RAM 330 stores audio program 340, audio (e.g., MP3) files 350, and reverse digital audio playback device (DAPD) application programming interface (API) 360. Reverse DAPD API 360 further comprises reverse DAPD API program 362 and DAPD specific data 364.

During normal operation of DAPD 150, DSP 305 executes audio program 340 in order to play one or more of audio files 350 selected by the user. User commands entered on control buttons 160 are received from user IF 320. As noted above, if the user decides to download audio files, such as MP3 files, to DAPD 150 or to edit audio files already on DAPD 150, the user launches UI application program 250 on PC 105. In an advantageous embodiment of the present invention, the launching of UI application program 250 causes DSP 305 to automatically launch reverse DAPD API 360. DAPD 150 uses reverse DAPD API 360 to access UI application program 250 in order to control at least a portion of the user interface associated with UI application program 250.

DAPD specific data 364 may comprise, for example, a web site URL and a graphics file logo for the manufacturer of DAPD 150. Reverse DAPD API program 362 comprises, for example, executable code that formats the DAPD-specific information so that it may be transmitted to UI application program 250 for subsequent display in the user interface.

FIG. 4 depicts flow diagram 400, which briefly summarizes the operation of exemplary DAPD 150 according to one embodiment of the present invention. Initially, the user launches user interface application program 250 in PC 105 in order to access and control DAPD 150 (process step 405). Next, UI application program 250 uses reverse DAPD API 260 to obtain information specific to DAPD 150. This may be accomplished by executing reverse DAPD API 260 in PC 105 or in DAPD 150 (process step 410). In either case, DAPD 150 is able to control the user interface associated with UI application program 250 in order to display logos or information selected by the manufacturer of DAPD 150 in a reserved portion of the user interface (process step 415). In this way, the manufacturer of DAPD 150 does not have to rely on the manufacturer of the UI application program 250 to provide support for DAPD 150. Using the present invention, makers of user interface application programs can designate certain agreed-upon portions of the user interface display area for use by the DAPD manufacturer. This allows DAPD manufacturers to create brand relationships with consumers, to implement web site strategies, to provide consumers with technical and product support, and the like.

Although the present invention has been described in detail, those skilled in the art should understand that they can make various changes, substitutions and alterations herein without departing from the spirit and scope of the invention in its broadest form.

What is claimed is:

1. A digital audio playback device (DAPD) comprising:
an external interface included within the digital audio playback device and coupled to a connected processing system, said connected processing system executing a user interface application program that accesses and controls said digital audio playback device via said external interface;
a memory included within the digital audio playback device and coupled to said external interface, wherein said memory stores a reverse DAPD application programming interface (API); and
a processor coupled to said memory and said external interface that executes said reverse DAPD API, said reverse DAPD API causes said processor to access and control a user interface associated with said user interface application program, wherein the user interface associated with said user interface application program is displayed on a monitor screen associated with said connected processing system,
wherein said reverse DAPD API comprises first data which identifies a manufacturer of said digital audio playback device, and wherein said reverse DAPD API causes an identity of the manufacturer to be displayed on the monitor screen in a human-readable form.

2. A digital audio playback device (DAPD) comprising:
an external interface included within the digital audio playback device and coupled to a connected processing system, said connected processing system executing a user interface application program that accesses and controls said digital audio playback device via said external interface;

a memory included within the digital audio playback device and coupled to said external interface, wherein said memory stores a reverse DAPD application programming interface (API); and a processor coupled to said memory and said external interface that executes said reverse DAPD API, said reverse DAPD API causes said processor to access and control a user interface associated with said user interface application program, wherein the user interface associated with said user interface application program is displayed on a monitor screen associated with said connected processing system, wherein said reverse DAPD API comprises first data associated with a manufacturer of said digital audio playback device, and wherein said reverse DAPD API causes said processor to access and control at least a portion of said user interface to display said first data in said at least a portion of said user interface displayed on said monitor screen.

3. The digital audio playback device as set forth in claim 2 wherein said first data comprises a graphics file comprising a logo image associated with said manufacturer.

4. The digital audio playback device as set forth in claim 2 wherein said first data comprises a Universal Resource Locator (URL) associated with an Internet web site associated with said manufacturer.

5. A processing system comprising:

an external interface included within and coupled to a connected digital audio playback device, said connected digital audio playback device plays audio files stored in said digital audio playback device;

a memory included within the digital audio playback device and coupled to said external interface, wherein said memory stores a user interface application program that accesses and controls said digital audio playback device via said external interface and that stores a reverse DAPD application programming interface (API); and a processor coupled to said memory and said external interface that executes said user interface application program and said reverse DAPD API, said reverse DAPD API communicates with said digital audio playback device and enables said digital audio playback device to access and control a user interface associated with said user interface application program, wherein the user interface associated with said user interface application program is displayed on a monitor screen associated with said processing system, wherein said reverse DAPD API comprises first data indicative of an identity of a manufacturer of said digital audio playback device, and wherein said reverse DAPD API causes an identity of said manufacturer to be displayed in said at least a portion of said user interface displayed in said monitor screen.

6. A processing system comprising:

an external interface included within and coupled to a connected digital audio playback device, said connected digital audio playback device plays audio files stored in said digital audio playback device;

a memory included within the digital audio playback device and coupled to said external interface, wherein said memory stores a user interface application program that accesses and controls said digital audio playback device via said external interface and that stores a reverse DAPD application programming interface (API); and a processor coupled to said memory and said external interface that executes said user interface application program and said reverse DAPD API, said reverse DAPD API communicates with said digital audio playback device and enables said digital audio playback device to access and control a user interface associated with said user interface application program, wherein the user interface associated with said user interface application program is displayed on a monitor screen associated with said processing system, wherein said reverse DAPD API comprises first data associated with an identity of a manufacturer of said digital audio playback device, and wherein said reverse DAPD API enables said digital audio playback device to access and control at least a portion of said user interface to display said first data in said at least a portion of said user interface displayed on said monitor screen.

7. The processing system as set forth in claim 6 wherein said first data comprises a graphics file comprising a logo image associated with said manufacturer.

8. The processing system as set forth in claim 6 wherein said first data comprises a Universal Resource Locator (URL) associated with an Internet web site associated with said manufacturer.

9. A method of displaying information on a monitor screen, said method for use in association with a digital audio playback device (DAPD) and a connected processing system connected to the digital audio playback device, the method comprising the steps of:

executing via a first processor in the connected processing system a user interface application program that accesses and controls the digital audio playback device; and executing via a second processor a reverse DAPD application programming interface (API) in the digital audio playback device, wherein the step of executing the reverse DAPD API enables the digital audio playback device to access and control a user interface associated with the user interface application program, wherein the user interface associated with said user interface application program is displayed on a monitor screen associated with the connected processing system, wherein the reverse DAPD API comprises first data associated with a manufacturer of the digital audio playback device and wherein the step of executing the reverse DAPD API comprises the substep of accessing and controlling at least a portion of the user interface displayed on the monitor screen.

10. The method as set forth in claim 9 wherein the step of executing the reverse DAPD API comprises the substep of displaying the first data in the at least a portion of the user interface.

11. The method as set forth in claim 10 wherein the first data comprises a graphics file comprising a logo image associated with the manufacturer.

12. The method as set forth in claim 10 wherein the first data comprises a Universal Resource Locator (URL) associated with an Internet web site associated with the manufacturer.

* * * * *